United States Patent [19]

Clappier et al.

[11] Patent Number: 4,626,767
[45] Date of Patent: Dec. 2, 1986

[54] CONSTANT CURRENT R.F. GENERATOR

[75] Inventors: Robert R. Clappier, Los Altos; Steven J. Smith, Redwood City, both of Calif.

[73] Assignee: Metcal, Inc., Menlo Park, Calif.

[21] Appl. No.: 684,730

[22] Filed: Dec. 21, 1984

[51] Int. Cl.$^4$ ............................................. G05F 1/44
[52] U.S. Cl. .................................. 323/280; 323/281; 455/117
[58] Field of Search ...................... 323/275, 280, 281; 455/115, 117

[56] References Cited

U.S. PATENT DOCUMENTS 3,852,669 12/1974 Bownan et al. ..................... 455/117
4,147,985 4/1979 Rogers ................................ 455/117
4,447,783 5/1984 Quick ................................. 323/275

Primary Examiner—Peter S. Wong
Assistant Examiner—Anita M. Ault
Attorney, Agent, or Firm—Hall, Myers & Rose

[57] ABSTRACT

The present invention achieves constant voltage at radio frequencies to drive a constant voltage to constant current converter, by employing a tightly coupled d.c. feedback loop to control the voltage via a transformer to the drain of a FET operated as a Class C amplifier in the saturated mode whereby among other advantages, the amplifier can withstand, without damage, very high VSWRs. Control is affected by a high gain differential amplifier which compares a d.c. voltage derived from the r.f. output of the system against a highly stable d.c. voltage reference. A controller, responding to the output of the differential amplifier causes a first level of voltage to be applied to the drain of the FET when the system is not loaded and causes a second voltage varying between said first level and a higher level when the system is loaded. In the lower voltage condition the controller is effectively removed from the system so that it does not have to drop a high voltage to a low voltage; the low voltage being supplied effectively from a separate source.

12 Claims, 3 Drawing Figures

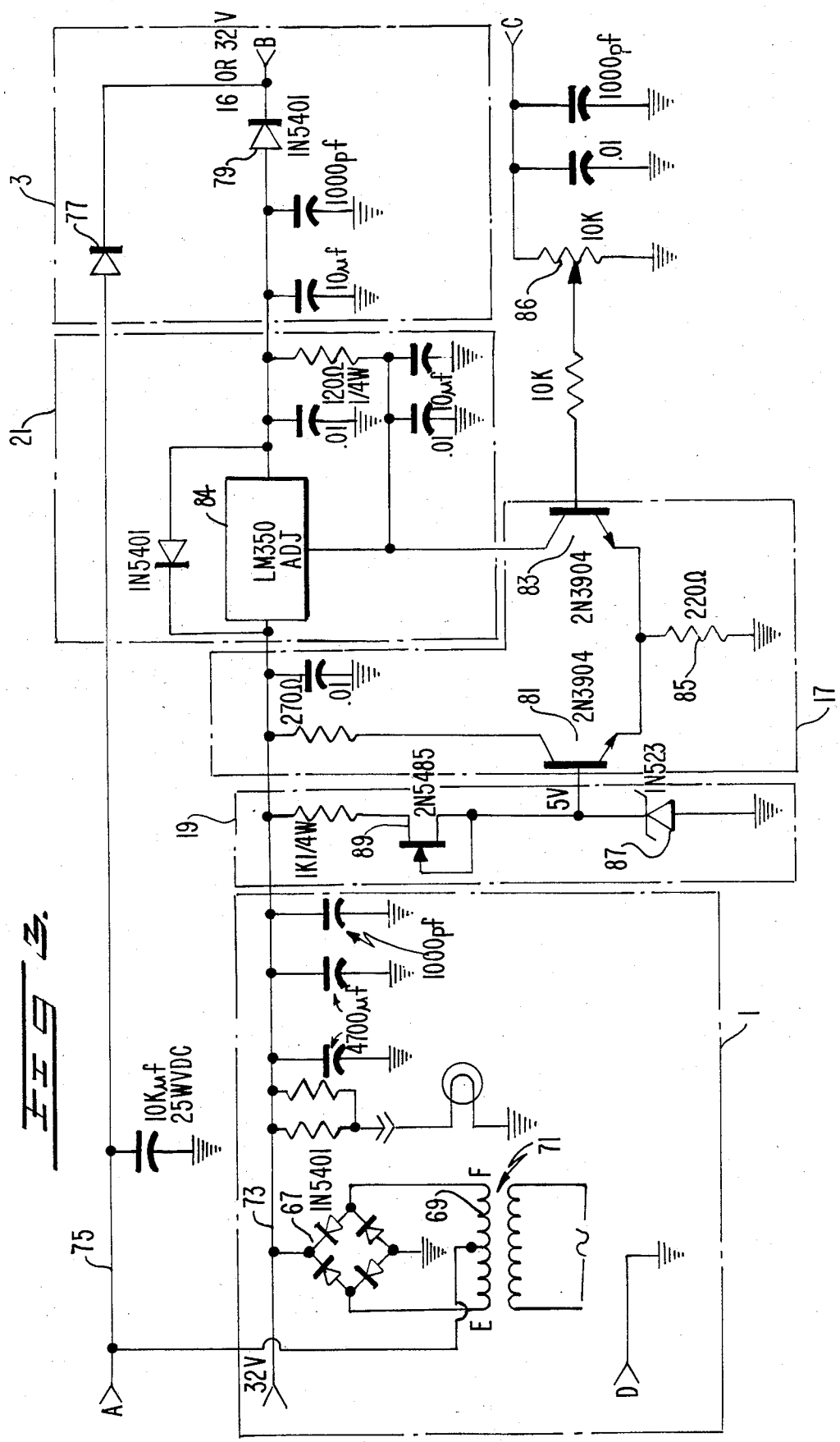

CONSTANT CURRENT R.F. GENERATOR

RELATED APPLICATIONS

The present application is related to co-pending U.S. patent application Ser. No. 628,570 filed July 6, 1984 in the name of Philip A. Carter and entitled Constant Voltage to Constant Current Circuit. The present application is also related to co-pending U.S. patent application Ser. No. 586,713 filed Mar. 6, 1983 now abandoned in favor of a continuation-in-part application Ser. No. 666,346 filed Oct. 30, 1984 and entitled High Efficiency Auto Regulating Heater. Both applications are assigned to the same assignee as the present invention and the subject matter of such applications are incorporated herein by reference.

BACKGROUND OF THE INVENTION

The present invention relates to constant current power supplies and more particularly to constant current power supplies capable of delivering high frequency current to a poorly matched load.

In U.S. Pat. No. 4,256,945 of Carter and Krumme, there is described an auto regulating electric heater having a laminated structure; one lamina of which has high magnetic permeability and high resistance and another lamina of which is non-magnetic and has a low resistance (such as copper) in electrical contact, and therefore, thermal contact with the first lamina. This structure is adapted to be connected across a constant current, a.c., source such that the layers are in a sense in parallel across the source.

Due to skin effect, the current is initially confined to the high magnetic permeability, high resistance layer so that $P = KR_1$ where P is Power, K is $I^2$ which is a constant, and $R_1$ is the effective resistance of the permeable material at high current concentrations. The dissipation of power heats the layer until it approaches its Curie temperature. The permeability of the lamina decreases towards the level of the second layer, copper for instance, at about its Curie temperature. The current is no longer confined to the high resistivity first lamina by the magnetic properties of the first lamina, and spreads into the copper layer; the resistance to the current drops materially, the power consumed, $P = KR_2$ where $R_2 << R_1$, is greatly reduced and the heating effect is reduced to a level that maintains the device at or near the Curie temperature. The device thus thermally auto regulates over a narrow temperature range about the Curie temperature.

The current source employed in the aforesaid patent is typically a high frequency source, to insure that the current is confined to the thin, high resistivity, magnetic layer until the Curie temperature of the magnetic material is attained. Specifically, the maximum regulation is achieved when the thickness of the magnetic layer is of the order of one to 1.8 skin depths at the frequency of operation. Under these circumstances, the maximum change in effective resistance of the structure is achieved at or about the Curie temperature. This fact can be demonstrated by reference to the equation for skin depth in a monolithic, i.e., non-laminar magnetic structure:

$$S.D. = 5030\sqrt{\rho/\mu f} \text{ cm},$$

where $\rho$ is the resistivity of the material in ohm-cms, $\mu$ is magnetic permeability mu and f is frequency of the current. The field falls off in accordance with $e^{-x}$ where x is thickness/skin depth. Accordingly, in a monolithic structure, by calculation, 63.2% of the current is confined to one skin depth in the high mu material. In the region of the Curie temperature, where $m\mu = 1$, the current spreads into a region $S.C. = 5030\sqrt{\rho/f}$ cm. If mu was originally equal to 200 (200–5000 being possible), the skin depth in the region at the Curie temperature increases by the square root of 200; i.e., the skin depth in the monolithic structure is now 14.14 times greater than with $\mu = 200$.

The same type of reasoning concerning the skin effect may be applied to the two layer laminar structure in the aforesaid patent. Below the Curie temperature, the majority of the current flows in the magnetic layer when the thickness of this layer is nominally one skin depth of the material below the Curie temperature. In the region of the Curie temperature, the majority of the current now flows in the copper and the resistance drops dramatically. If the thickness of this high mu material were greater than two skin depths, the percentage change of current flowing in the high conductivity copper would be less and the resistivity change would not be as dramatic.

Similarly, if the thickness of the high mu material were materially less than one skin depth, the percentage of current flowing in the high resistivity material at a temperature less than the Curie temperature would be less so that the change of resistance at the Curie temperature would again not be as dramatic. The region of 1.0 to 1.8 skin depth is preferred.

An exact relationship for the two layer case is quite complex. The basic mathematical formulas for surface impedance from which expressions can be obtained from the ratio of the maximum resistance, R max, below the Curie temperature, to the minimum resistance, R min, above the Curie temperature, are given in Section 5.19, pp. 298–303 of the standard reference, "Fields and Waves in Communications Electronics," 3rd Edition, by S. Ramo, J. R. Winnery, and T. VanDuzer, published by John Wiley and Sons, New York, 1965. Although the theory described in the above reference is precise only for the case of flat layers, it is still accurate enough for all practical applications in which the skin depth is substantially less than the radius of curvature.

A difficulty is encountered when any of the above heaters are employed in soldering irons such as illustrated in FIG. 4 of the aforesaid patent. The impedance of the soldering iron, due to its relatively small size, is quite low (of the order of 0.1 to 0.25 ohm) and in consequence, presents a poor impedance match to the source. This problem is mitigated to some extent by including impedance matching circuits in the handle of the soldering iron. In such a case, however, a greater resistance appears in the handle than at the tip of the iron, making the handle quite hot and the overall soldering iron performance quite inefficient.

In the aforesaid co-pending application Ser. No. 666,346 for High Efficiency Auto regulating Heater, a heater illustrated as a soldering iron, is described which provides a substantially matched load to the supply below the temperature at which the permeability of the magnetic material begins to fall. Once the permeability begins to degrade, however, the impedance match also degrades reaching a quite poor level, a VSWR of as high as 5 or 6, when the permeability of the magnetic material falls to about 1. With such a VSWR prior art power supplies are subject to destruction.

BRIEF DESCRIPTION OF THE PRESENT INVENTION

It is a primary object of the present invention to provide a high frequency constant current power supply that can safely supply poorly matched loads.

It is another important object of the present invention to provide a high frequency constant current source that is relatively inexpensive and which has low power dissipation.

An r.f. signal is generated by a modified Pierce oscillator which in use with a heater of the type described above is operated at 13.56 MHz although the exact frequency is not critical. The small signal produced by the oscillator is amplified and supplied to an output stage operating as a Class C amplifier. The Class C amplifier employs an FET driven by a constant voltage input and with the drain operating in the saturated region. Such operation effectively isolates the input from the output of the power amplifier output stage and permits large VSWRs to be accommodated. Power output is varied by changing the d.c. supply voltage applied to the output stage.

The output voltage from the FET has a high content of harmonic distortion and is filtered in a low pass filter to provide a pure sign wave. The output of the filter is fed to a constant voltage to constant current circuit which may be as set forth in the aforesaid application Ser. No. 628,570. Thus it is necessary for the control circuits of the present invention to provide a quite constant voltage output from the power output stage. This feature is achieved by producing a d.c. signal proportional to the high frequency output of the filter and controlling the d.c. supply voltage to the drain circuit of the FET as a function of variation of this d.c. signal relative to a fixed reference voltage in a high gain differential amplifier. In order to provide a highly regulated voltage, the small d.c. signal variations are greatly amplified.

In a specific embodiment, in order to reduce heating of the supply and power drain, when the load is idling one voltage level is supplied to the voltage controller and when the load is supplying power (heat energy) a higher voltage is supplied to the controller whereby the drain of the power output FET operates over different voltage supply levels at idle and under load, greatly reducing average power consumption and overall heating. Voltage range switching may be effected by diode switching between two voltage sources; the diode switches being driven by the output from the differential amplifier. Pursuant to this approach, rather than requiring large voltage drops across a d.c. power control circuit, the d.c. power controller is totally removed from the circuit during idling and reintroduced into the circuit when a load is placed on the heater, highly regulated constant current not being required during idling since conditions are static.

BRIEF DESCRIPTION OF THE DRAWING

FIG. 3 is a circuit diagram of the power supply, controller, high gain amplifier, comparator and reference voltage generator illustrated in block form in FIG. 1.

DETAILED DESCRIPTION OF THE INVENTION

The power supply of the present invention is of general utility and may be employed in any environment in which it is desired to supply a highly regulated a.c. voltage or current to a load having a widely varying impedance. In order to specify the details of a specific supply, the supply is discussed in terms of providing approximately 35 watts to a soldering iron as set forth in the aforesaid co-pending U.S. application Ser. No. 666,346 filed Oct. 30, 1984.

The term "idle" or "idling" when applied to a soldering iron means that the iron is not in use and is just sitting in its holder, in air or the like. When applied to a self regulating soldering iron, the specific condition of "idling" is with the iron unloaded so that the ferromagnetic material is in the range of its Curie temperature and its mu is at or approaching 1.

Figure 1:
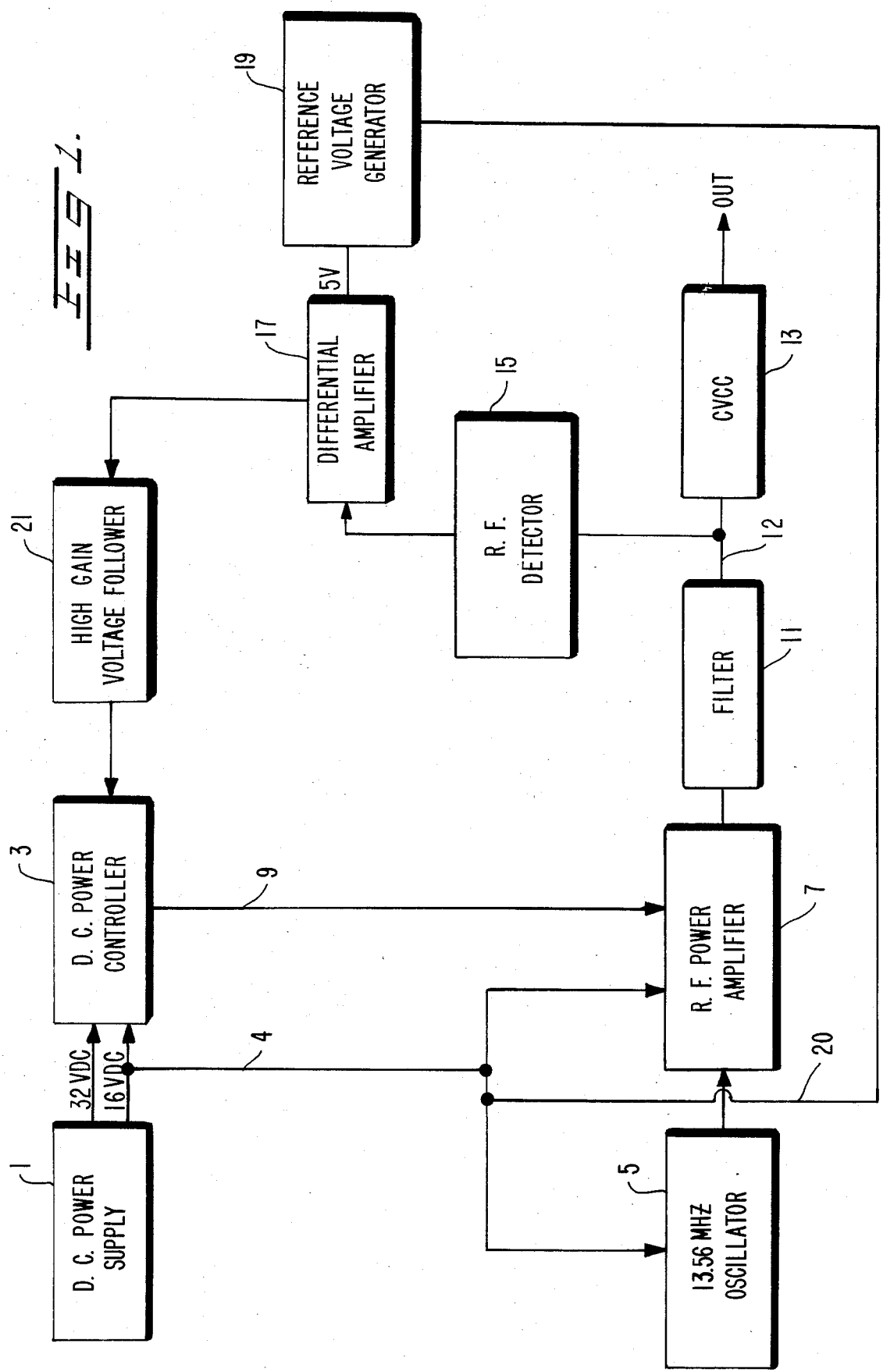
FIG. 1 is a block diagram of the system of the present invention.

Referring now to FIG. 1 of the accompanying drawings, there is illustrated a block diagram of the present invention. A d.c. power supply 1 of completely conventional design provides two output voltages of, for instance, 16 volts and 32 volts; the 32 volts being supplied to a d.c. power controller 3 while 16 volts is supplied via lead 4 to the controller 3 and also to a 13.56 MHZ modified Pierce oscillator 5 and to r.f. power amplifier 7.

The controller 3 provides to the power amplifier 7, via a lead 9, 16 volts on idle or a voltage in the range of 16 volts to approximately 32 volts under load. The output voltage of the amplifier 7 is supplied via filter 11 and lead 12 to a constant voltage to constant current converter 13 which may be of the type described in copending U.S. patent application Ser. No. 628,570. The output of the converter 13 is supplied to the system load.

A small part of the 13.56 MHZ a.c. voltage appearing on lead 12 is supplied to an r.f. detector 15 that provides to one input of a differential amplifier 17, a d.c. voltage proportional to the a.c. voltage on lead 12. The other input of the differential amplifier receives a constant 5.0 volt reference from a reference voltage generator 19 supplied with 16 volts via leads 4 and 20. The output of the differential amplifier 17 is supplied to controller 3 via a high gain voltage follower 21.

In operation a voltage, between 16 and 32 volts, is supplied to the RF power amplifier as a function of the voltage on lead 12. If the voltage on lead 12 remains above a predetermined voltage the differential amplifier 17 supplies a low voltage to the high gain voltage follower 21. The low output of this high gain voltage follower 21 causes the controller 3 to provide 16 volts on lead 9. This condition exists whenever the load is idling and there is little drain on the final output of the RF generator. Whenever a load is developed on the RF generator and the power drain increases, the voltage or lead 12 drops below the predetermined voltage and the voltage supplied to the differential amplifier 17 falls below 5.0 volts. The controller 3 now supplies to the amplifier 7, a voltage in the range from 16 volts to 32 volts as required to maintain the voltage on lead 12 at the desired constant voltage. Thus it can be seen that the controller during idling does not control and is effectively out of the circuit and does not provide power or generate heat. It is also noted that the control circuits for the r.f. are d.c. circuits, greatly simplifying the control components and functions.

Figure 2:
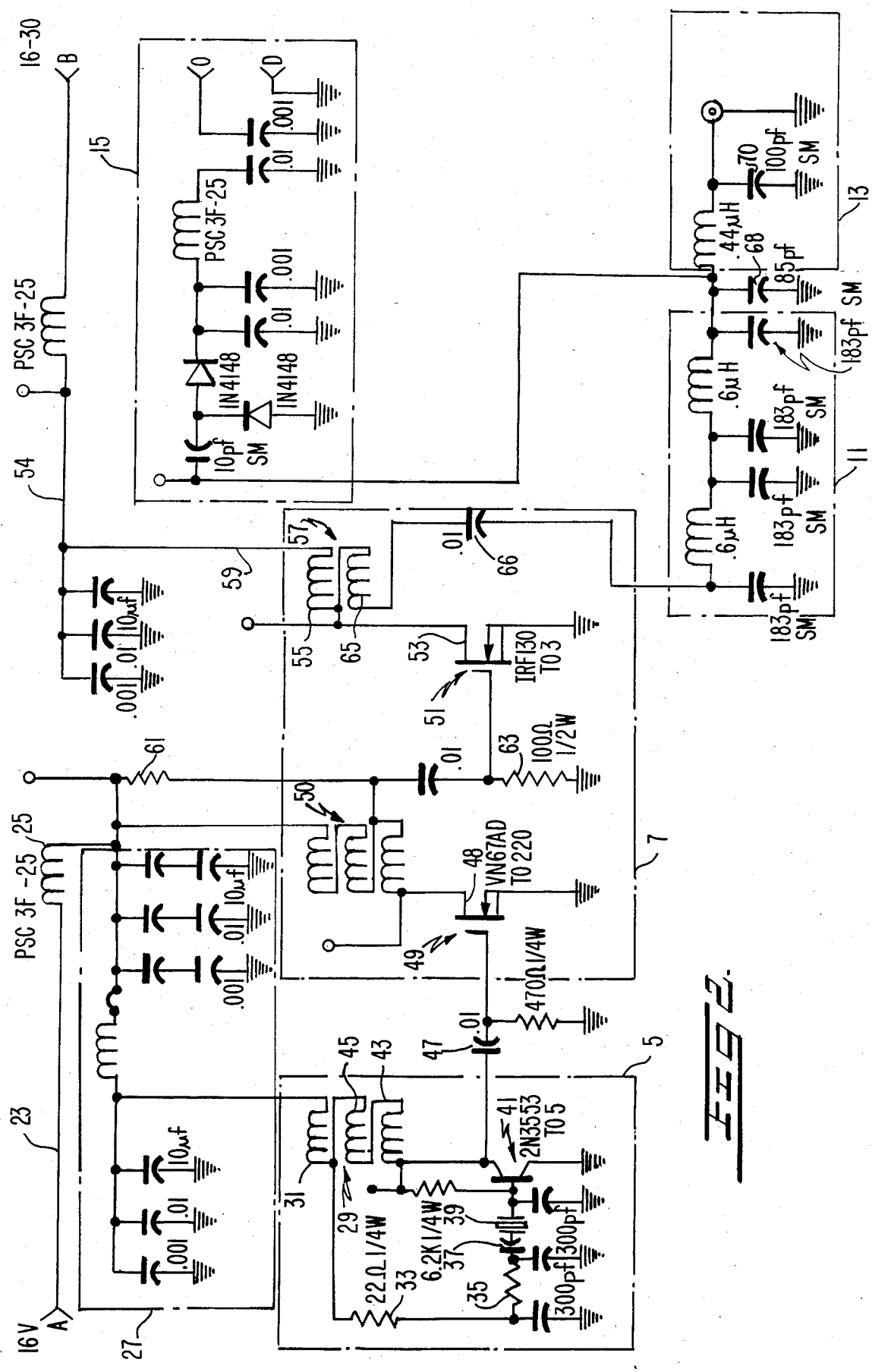
FIG. 2 is a circuit diagram of the oscillator, paver amplifier, filter and r.f. detector illustrated in block form in FIG. 1.

Referring now specifically to FIG. 2 of the accompanying drawings, there is illustrated the oscillator 5, r.f. power amplifier 7, the filter 11, the r.f. detector 15 and the first stage of the constant voltage constant current circuit 13.

A lead 23 supplies 16 volts via a choke 25 and filter 27 to the modified Pierce oscillator 5. The oscillator 5 is modified by the use of a transformer 29 which supplies voltage via winding 31 of transformer 29, resistors 33 and 35, capacitors 37 and crystal 39 to the base of transistor 41 connected in common emitter mode. The collector of transistor 41 is connected through transformer windings 43 and 45 of transformer 29 to the junction of winding 31 and resistor 33. The effect of this connection is to provide a significant impedance/stepdown to permit the collector of transistor 41 to drive the unusually low impedance of the low pass filter in the base input circuit and maintain excellent voltage stability.

The collector of transistor 41 is connected via a capacitor 47 to the gate of driver FET 49 located in the r.f. power amplifier 7. The drain 48 of FET 49 receives 16 volts d.c. from the junction of the choke 25 and filter 27 via the three windings of a transformer 50 employed for matching to the very low input impedance of the FET 49 and supplying a highly amplified oscillator output voltage to the gate of power output, MOSFET 51. The signal on the gate of FET 51 is of a constant amplitude; control of the power output level of the amplifier 7 being determined by the d.c. voltage supplied to the drain circuit of FET 51. The drain 53 is connected via winding 55 of transformer 57 to a lead 59 on which appears 16 volts or a voltage in a range of a little above 16 volts to 30 volts as determined by d.c. power controller 3 as explained subsequently.

Certain features of the circuit should be noted. Two 100 ohm drain resistors 61 and 63 are connected between the 16 volt supply and ground and thus are in parallel with the input capacitance of the FET 51 to provide a stable input condition and assist in maintaining a constant voltage on the gate. The drain 53 is connected through the secondary winding 65 of transformer 57 which doubles the a.c. voltage across the winding 65 relative to that on the drain; the transformer (a transmission-line type) further serving to match the impedance of the output circuit of FET 51 to the filter 11 and the load.

It should be noted that the d.c. voltage control on the drain circuit of the FET 51 varies at a very low frequency and further provides constant amplitude drain modulation.

Relative to the ability of the power output FET 51 to withstand large VSWRs, as previously stated, an amplifier can be considered a high gain amplifier from input to output and a very low gain amplifier from output to input. However, if the power going from output to input becomes a significant portion of the forward power, control of the amplifier may be lost with disastrous results. By operating the FET 51 in the saturated mode, the FET can only go from full on to full off and never operates in its linear range, and the reflected power cannot appreciably affect the reverse power through the FET 51. Thus the device can withstand appreciable VSWRs of the order of 5 to 6.

Another result of operating the FET 51 as a Class C amplifier or in the saturated mode is that output power is directly related to the d.c. power applied to the drain circuit. The voltage applied to transformer 57 by drain 53 of FET 51 is either very close to zero volts when the FET 51 is turned on or equal to the voltage on lead 54 when the FET 51 is turned off. Thus the d.c. voltage supplied to circuit 7 from lead 54 can effectively control the output power. Yet another consequence of operating in the saturated mode is that since the FET 51 is not operated in its linear range, its power dissipation is minimized, reducing the power dissipated by the entire RF generator.

The output voltage from the FET 51 has a very large harmonic content and thus the use of the low pass filter 11 which constitutes two pi-filters in series. The output from the filter 11 is a pure sine wave and is supplied to the input stage of the CVCC 13 which stage constitutes the phase shift network of the CVCC. Capacitors 68 and 70 of the input of the CVCC 13 assist in the low pass function of filter 11.

The r.f. detector 15 is a voltage doubler rectifier having heavy filtering by a Pi-network to provide a smooth d.c. output signal proportional to the voltage on the lead 12.

Reference is made to FIG. 3 of the accompanying drawings for the circuit diagrams of the elements 1, 3, 17, 19 and 21 of FIG. 1. The letters A, B, C and D, indicating terminals in FIG. 2, are illustrated in FIG. 3 at the interconnection points.

The power supply constitutes a full wave rectifier bridge 67 having opposed corners fed from the secondary 69 of a transformer 71. A second set of opposed corners of the bridge 67 are connected respectively to a ground and to lead 73 on which 32 volts are developed. The winding 69 is center tapped to provide 16 volts on lead 75.

The lead 75 is connected through diode 77 to terminal B which in FIG. 2 supplies voltage to the drain of FET 51. If the diode 77 is forward biased, 16 volts are passed to the terminal B and the voltage is unregulated; regulation not being required since under these conditions the system is idling.

When the system is loaded, the 32 volts on lead 73 is modified by controller 3 and passed through diode 79 to terminal B, the value of the voltage being a function of the amplitude variations on the output of the differential amplifier 17.

Referring again to the details of the circuits of FIG. 3, transistors 81 and 83 have their emitters connected together and to ground through resistor 85, and with their associated components, constitute a high gain differential amplifier. The base of transistor 81 is connected to the junction of zener diode 87 and an N Channel, depletion mode FET 89 which elements are connected in series between lead 73 and ground. The FET 89 is connected as a constant current source to the zener diode which in consequence maintains a fixed reference voltage (5.0 volts) on the base of transistor 81. The combination of the constant voltage characteristic of zener diode 87 and the constant current provided by FET 89 produce an extremely stable reference voltage despite large variations that are possible in the d.c. voltage on lead 73. The heavy filtering of the power supply voltage by the filter of the power supply further assists in the stability of the voltage.

The base of the transistor 83 is connected to receive the output of the RF detector 15 appearing on terminal C via a potentiometer 86 employed to set the level of the voltage to be maintained on terminal C. The voltage at the base of transistor 83 is maintained very close to 5.0 volts by the action of the feedback loop and the voltage at terminal C is maintained at +5.0 volts or some higher value depending on the setting of potentiometer 86. The voltage applied to the transistor 83 from the potentiometer 86 is held at 5 volts by the circuit. Thus the output voltage to CVCC 13 can be raised or lowered and in consequence the power delivered can be varied to accommodate different loads or different irons. The differential amplifier 21 is a very high gain amplifier to provide large signal variations at its output in response to small difference in the voltages applied to the base of the transistors 81 and 83. This arrangement provides a very stiff feedback loop that maintains rigid control over the output voltage of this system if it tends to fall above or below the desired level.

Specifically small variations in current applied to the "ADJ" input of voltage regulator 84 utilized as a high gain voltage follower to feed controller 3 causes variation of the voltage applied to the diode 79 over the entire range from 7 to 32 volts; the voltage follower having a 1¼ volt minimum voltage drop from input to output. Whenever the voltage output of the voltage regulator 84 is below 16 volts, the diode 79 is back biased and the voltage on terminal B is nominally 16 volts. If the voltage at the output of the voltage regulator 84 exceeds the voltage on the lead 75 by the threshold level of the diode 79, the diode 79 is forward biased, the diode 77 is back biased. The voltage on terminal B now varies as a function of the output from voltage follower 84, to vary the voltage on the drain circuit of the FET 51 to maintain a constant voltage on lead 12.

The circuit of the present invention is primarily a constant voltage regulator which uses the CVCC 13 to produce a constant current. The voltage regulator utilizes, to a very great extent, conventional circuit elements but such elements are employed in unusual circuits. The rigid voltage control at such high frequencies in a relatively inexpensive supply is achieved by modifying a standard Pierce oscillator, operating the power output FET as a Class C amplifier, using the LM350 as a high gain voltage follower and using tightly coupled d.c. feedback (servo) loop to control RF voltages.

I claim:

1. A voltage source for producing a constant output voltage at radio frequencies in the presence of large voltage standing wave ratios comprising,
    a field effect transistor having at least a gate and a drain,
    means for applying a radio frequency signal to said gate,
    means for applying a voltage to said drain including a transformer having a first winding in series with said drain,
    said field effect transistor having an output circuit including a second winding of said transformer, and
    means for applying a first d.c. voltage to said first winding remote from said drain to produce operation of said field effect transistor in its saturated region for Class C operation, and
    means for varying the voltage applied to the said first winding remote from said drain to provide a constant amplitude output voltage at the output of said second winding.

2. A voltage source according to claim 1 wherein said means for varying comprises
    a drain circuit,
    a feedback loop from said output of said secondary winding to said means for applying a first d.c. voltage to said drain circuit.

3. A voltage source according to claim 2 wherein said loop comprises
    a drain circuit,
    a radio frequency detector for producing a d.c. signal indicative of the a.c. voltage at the output of said secondary winding,
    means for comparing said d.c. signal with a fixed d.c. reference voltage to produce a second d.c. voltage indicative of deviation of said output voltage from a desired value, and
    a controller responsive to said second d.c. voltage to vary said first d.c. voltage.

4. A voltage source according to claim 3 further comprising
    a source of a first fixed d.c. voltage,
    a source of a second fixed d.c. voltage of greater amplitude than said first fixed d.c. voltage,
    said controller connected to receive and produce from said second fixed d.c. voltage a varying first d.c. voltage that varies as a function of said second d.c. voltage over a range below and approaching said second fixed d.c. voltage, and
    further means for applying in the alternative said first fixed d.c. voltage or said varying first d.c. voltage to said drain circuit,
    said first fixed d.c. voltage being applied to said drain circuit when said constant amplitude output voltage is equal to a desired value,
    said varying first d.c. voltage being applied to said drain circuit when said constant amplitude output voltage falls below said desired value.

5. A voltage source according to claim 3 wherein said means for comparing comprises,
    a high gain differential amplifier for producing a variable current output connected to said controller to vary the voltage output thereof over a large voltage range below said second fixed d.c. voltage.

6. A voltage source according to claim 4 wherein said further means comprises,
    means for applying said varying first d.c. voltage to said drain circuit when said varying first d.c. voltage exceeds the amplitude of said first fixed d.c. voltage.

7. A voltage source according to claim 3 wherein said controller has its input connected to a source of fixed voltage,
    a differential amplifier comprising a pair of transistors having common emitters connected to ground through a common resistor,
    one of said transistors connected to receive a fixed voltage on its base and its collector,
    said d.c. signal connected to the base of said other transistor,
    said collector of said other transistor connected to supply a varying current to the control input of said controller to vary the voltage drop across said controller as a function of said d.c. signal.

8. A voltage source according to claim 1 wherein said transformer is a transmission line transformer.

9. A voltage source for producing a constant voltage at radio frequencies in the presence of large voltage standing wave ratios, comprising,
    a field effect transistor having at least a gate and a drain and having an output circuit including a drain circuit, and means for varying the d.c. voltage applied to said drain circuit to produce a constant amplitude radio frequency voltage at the output of said transistor.

10. A voltage source according to claim 9 wherein said means for varying comprises
a tightly coupled d.c. servo loop including an r.f. detector for producing a second d.c. signal proportional to the a.c. output voltage of said transistor, a high gain differential amplifier for producing a control signal as a function of the differences between said second d.c. voltage and a reference and means varying the d.c. voltage applied to said drain circuit as a function of said control signal.

11. A voltage source according to claim 9 wherein said FET is biased to operate as a Class C amplifier.

12. A voltage source for producing a constant amplitude RF output voltage in the presence of large load variations producing large voltage standing wave ratios comprising
a field effect transistor having at least a gate and a drain,
means for applying an RF signal to said gate,
a d.c. voltage source,
a drain circuit including an output circuit and an impedance connected between said voltage source and said drain,
means for applying voltage from said d.c. voltage source to said impedance remote from said drain, and
means for varying said voltage applied to said impedance as a function of variations of the amplitude of said RF voltage to maintain said RF voltage substantially constant.

* * * * *